United States Patent [19]

Fowler et al.

[11] Patent Number: 4,573,009
[45] Date of Patent: Feb. 25, 1986

[54] PRINTED CIRCUIT BOARD TEST FIXTURE WITH FLEXION MEANS FOR PROVIDING REGISTRATION BETWEEN THE TEST PROBES AND THE CIRCUIT BOARD

[75] Inventors: Pat Fowler, Castro Valley; Ernest C. Woods, Jr., Pleasant Hill, both of Calif.

[73] Assignee: Zehntel, Inc., Walnut Creek, Calif.

[21] Appl. No.: 558,889

[22] Filed: Dec. 7, 1983

[51] Int. Cl.$^4$ .................... G01R 31/02; H01R 4/64
[52] U.S. Cl. ........................ 324/158 F; 339/117 P
[58] Field of Search .......... 324/158 F, 73 PC, 158 P; 339/117 P

[56] References Cited

U.S. PATENT DOCUMENTS

| | | | |
|---|---|---|---|
| 3,016,489 | 1/1962 | Briggs et al. | 324/158 F |
| 3,654,585 | 4/1972 | Wickersham | 324/158 F X |
| 3,757,219 | 9/1973 | Aksu | 324/158 F |
| 4,017,793 | 4/1977 | Haines | 324/73 PC |
| 4,108,528 | 8/1978 | Long et al. | 324/158 P X |
| 4,138,186 | 2/1979 | Long et al. | 324/158 P X |
| 4,352,061 | 9/1982 | Matrone | 324/158 F |

OTHER PUBLICATIONS

No Author, "Improvement by Taking the Pins to the Board", Electronic Engineering, Dec. 1982, p. 9.

Primary Examiner—Stewart J. Levy
Assistant Examiner—Stephen M. Baker
Attorney, Agent, or Firm—Arnold, White & Durkee

[57] ABSTRACT

A printed circuit board "bed-of-nails" test fixture, of the type in which the circuit board is moved into electrical contact with the test probes, is provided with a means of ensuring accurate registration between the test probes and the corresponding test nodes on the board when contact is made. This registration is achieved by allowing the support surrounding the circuit board to bend by a hinge mechanism on all four sides, as the circuit board travels towards the probes. The substantially equal opposed forces on opposite edges of the board prevent lateral movement of the board during travel and thus ensure accurate registration.

15 Claims, 7 Drawing Figures

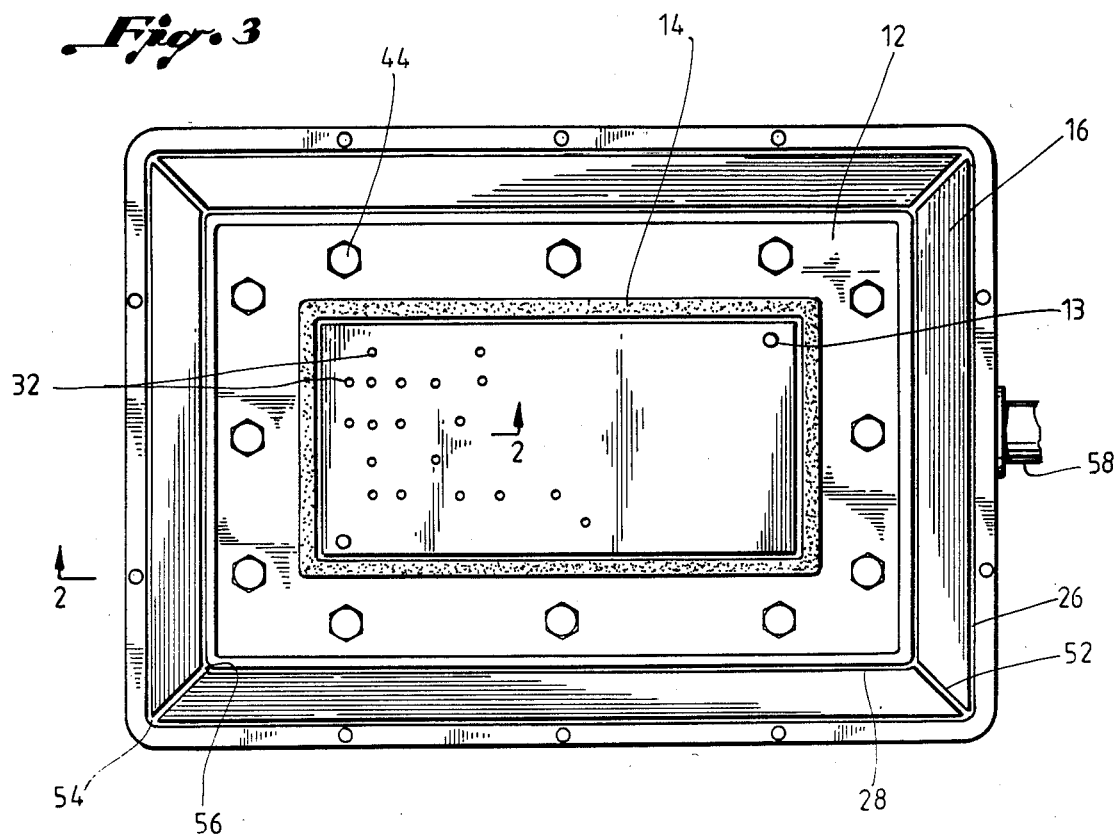
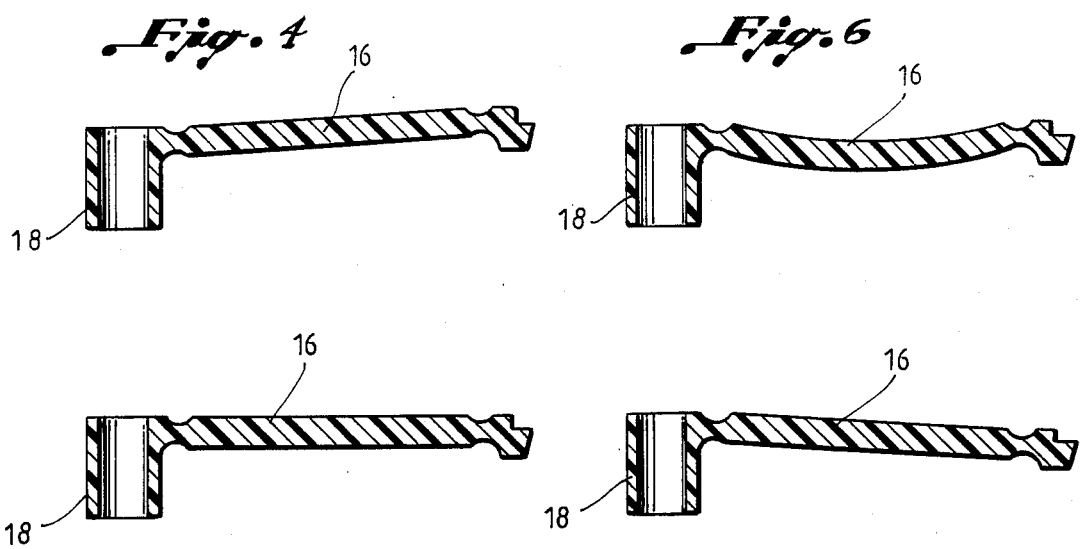

PRINTED CIRCUIT BOARD TEST FIXTURE WITH FLEXION MEANS FOR PROVIDING REGISTRATION BETWEEN THE TEST PROBES AND THE CIRCUIT BOARD

BACKGROUND OF THE INVENTION

This invention relates to "bed-of-nails" test fixtures for the electrical testing of printed circuit boards. In this testing, the circuit board is brought into electrical contact with a number of test probes, placed so as to contact predetermined test nodes on the board. Testing of the entire circuit, or of the individual circuits and components, or both, can then be carried out by means well known to those skilled in the art.

In circumstances when large numbers of circuit boards have to be tested, such as in assembly line production of widely used circuit boards, it is important that the test procedure can be carried out quickly. It is therefore important that the circuit board can be readily placed in and removed from the test fixture, with a minimum of operator skill required.

However, it is also very important that accurate registration is obtained between the probes and the corresponding test nodes on the circuit board. This registration must be repeatable over a large number of test cycles. Accuracy of registration is becoming increasingly more important as modern techniques allow greater component densities on the boards.

Other features advantageous in such test fixtures are ease of access to the probes and other test equipment, and reliability of operation.

In general, when the board is first placed in the test fixture, it is not in contact with the probes. Once in position, it is brought into contact with the probes so that the testing can begin. The simplest type of test fixture provides this contact by mechanically pressing the board onto the probes, using an assembly which provides evenly distributed pressure to the board, and which is mounted over the board. A major disadvantage of this system is that this assembly must be put in position after the board has been placed in the test fixture, and removed before the board can be removed from the fixture. These extra steps significantly increase the time required for loading and unloading the board, and increase operator fatigue. Another disadvantage is that the assembly on top of the board means that it is not possible for the operator to have access to components on the board during the test process. Such access is desirable in certain test operations.

Most commercially available test fixtures use a partial vacuum induced in the space between the board and the test bed in order to produce the relative movement of the two in order to bring the board into contact with the probes. In order to achieve this, a flexible airtight seal must be provided around the board. This has generally been provided by a rubber seal, with a spring means of returning the board to the upper position when the vacuum is released.

It is vitally important for successful testing that the board accurately registers with the probes when they are brought into contact. This is achieved by designing the fixture so that the board is accurately positioned relative to the probes when it is placed on the fixture, and by providing means which accurately guide the board and probes into contact, maintaining this accurate positioning. It can readily be appreciated that to do this the possibility of lateral movement of the board must be minimized. Further, the plane of the board, when it reaches the contact position, must be parallel to its original plane.

A number of ways of achieving this registration have been used in the prior art. In one, the board to be tested is the part which moves, and the guidance is provided by at least two tooling pins, which are mounted in and are perpendicular to the platen which carries the test probes. The printed circuit board to be tested has tooling holes, which are also used in the process of fabricating the board. The tooling pins are arranged so that the board tooling holes fit over them when the board is correctly positioned over the test probes. The movement of the board into contact with the probes is then guided by the tooling pins.

In the case of boards which are not provided with tooling holes, a similar system can be used using edge-guidance pins in place of tooling pins.

This use of tooling guide pins to produce guidance has a number of disadvantages. In use, the board can stick on the pins, but if too much play is allowed for the holes passing over the pins, lateral movement becomes possible. It is also possible for the board to twist during movement, so that it is no longer parallel its original plane, resulting in misalignment. Further, through use the pins can become misaligned or worn, decreasing the accuracy of registration. There is also an inherent fragility in the system, as the size of the tooling holes, and hence the thickness of the tooling pins, is limited by constraints of board size and design. The pins can be damaged if the operator is careless in placing the board, or if the board is forced onto the pins. Even slight displacement of the tooling holes can cause similar problems.

Another prior art means of producing registration is the use of linear bearings to guide the relative movements of the board and the platen. These bearings have similar problems of wear, fragility, sticking if not properly lubricated, and the possibility of the board becoming nonparallel during movement. As these bearings must have an internal clearance in order to operate, there is also the possibility of lateral movement. They must be handled carefully during disassembly of the fixture for maintenance purposes because any damage seriously impairs their effectiveness. The accurate placing of the board on the test fixture is ensured in this system by the use of short tooling pins to fit through the board tooling holes.

A third prior art system uses a fixed board, and moves the platen carrying the probes to bring the test probes into contact with the board. In this system the registration is achieved by guiding the probes through holes in an upper, non-moving platen. The registration in this system is inherently inaccurate because of the tolerance required in the upper platen holes in order to permit the probes to move through freely. This system has other disadvantages, in particular the holes often become clogged with debris from the board, and extremely accurate alignment between the pin positions on the bottom platen and the corresponding holes on the upper platen must be achieved, or a serious loss of registration accuracy results.

SUMMARY OF THE INVENTION

The above noted and other disadvantages of the prior art are overcome by providing a sealing support member for the circuit board, the support member having a hinge mechanism which provides accurate registration between the test probes and the test nodes on the board when the board is moved into contact with the probes.

The present invention provides a test fixture for use in the electrical testing of printed circuit boards, comprised of a substantially rigid platen which carries an array of electrical test probes, a substantially rigid top plate which supports the printed circuit board to be tested and a semi-flexible housing which is attached to the platen and which supports the top plate above the platen. The housing is provided with flexion means adapted so as to permit movement of the top plate from an upper position in which the circuit board is held above, and out of contact with, the probes, and a lower position in which the probes are in electrical contact with the circuit board. The flexion means is further adapted to guide the movement of the top plate so as to provide that each test probe contacts the corresponding test point on the circuit board. A means for moving the circuit board from the upper to the lower position and a means for returning the housing to the upper position when the testing is completed are provided.

Preferably, the means for moving the circuit board from the upper to the lower position is the creation of a partial vacuum in the chamber defined by the housing, the platen, the top plate and the circuit board.

In one embodiment, the housing is comprised of an upper rim, which holds and seals to the top plate, and a side wall which extends around the outer periphery of the rim. The side wall attaches and seals to the platen. The upper rim is provided with the flexion means.

In another embodiment, the flexion means is at least one pair of grooves opposed to each other on the upper and lower surfaces of the upper rim, each pair of grooves extending completely around the rim, parallel to the rim's periphery.

In a preferred embodiment, the flexion means is two pairs of grooves opposed to each other on the upper and lower surfaces of the upper rim, one pair of grooves extending close to, parallel to and completely around the outer periphery of the rim, and the other pair of grooves extending close to, parallel to and completely around the inner periphery of the rim.

Preferably, the flexion means further includes a pair of opposed groves extending diagonally from each outer corner of the rim to the nearest inner corner of the rim.

In a further embodiment, the housing is made of a semi-flexible pastics material.

Preferably, the housing is made of a polyolefin plastic.

The present invention further provides a means for guiding the movement of a circuit board in a test fixture used for the electrical testing of printed circuit boards, of the type in which the circuit board is supported above a platen which carries an array of electrical test probes and in which the circuit board is moved into electrical contact with the probes in order to carry out the testing so as to provide that each test probe contacts the corresponding test point on the circuit board. This means consists of a semi-flexible housing attached to the platen and carrying the circuit board above the platen. The housing has an upper rim which holds and seals to a means for carrying the circuit board, and a side wall which extends around the outer periphery of the rim and which is adapted to attach to the platen. The upper rim is provided with a means which, by flexion, provides vertical movement to the circuit board.

In another embodiment of the means for providing vertical movement, the means on the upper rim which provides flexion is at least one pair of grooves opposed on the upper and lower surfaces of the rim, each pair of opposed grooves extending completely around the rim, parallel to the periphery.

In a preferred embodiment, the flexion means is two pairs of opposed grooves, one pair of grooves extending close to, parallel to and completely around the outer periphery of the rim, and the other pair extending close to, parallel to and completely around the inner periphery of the rim.

Preferably the flexion means also includes a pair of opposed grooves extending diagonally from each outer corner of the rim to the nearest inner corner of the rim.

In yet another embodiment, the means for providing vertical movement is made of a semi-flexible plastics material.

In another preferred embodiment, the means for providing vertical movement is made of a polyolefin plastic.

It is an advantage of the invention that it provides a new and improved means for imparting vertical movement to the circuit board without the need for guide pins, linear bearings or the like, while providing accurate registration between the circuit board and the test probes. It is a further advantage of the invention that it is reliable, inexpensive, has a long life, is readily dismantled for rearrangement or repair of the probes and test equipment and is simple to use. It further provides an improved air tight seal.

The above and other objects and advantages of the present invention will become apparent from a detailed description of preferred embodiments when read in conjunction with the drawings.

BRIEF DESCRIPTION OF THE DRAWINGS

FIG. 3 is a top view of the fixture, showing the top and the upper rim of the housing.

FIG. 4 is a diagrammatic vertical cross-sectional view of one side of the upper rim of the housing in the up position.

FIG. 5 is the same view in the mid position.

FIG. 6 is the same view in the flexed position.

FIG. 7 is the same view in the lower position.

DETAILED DESCRIPTION OF A PREFERRED EMBODIMENT

Figure 1:
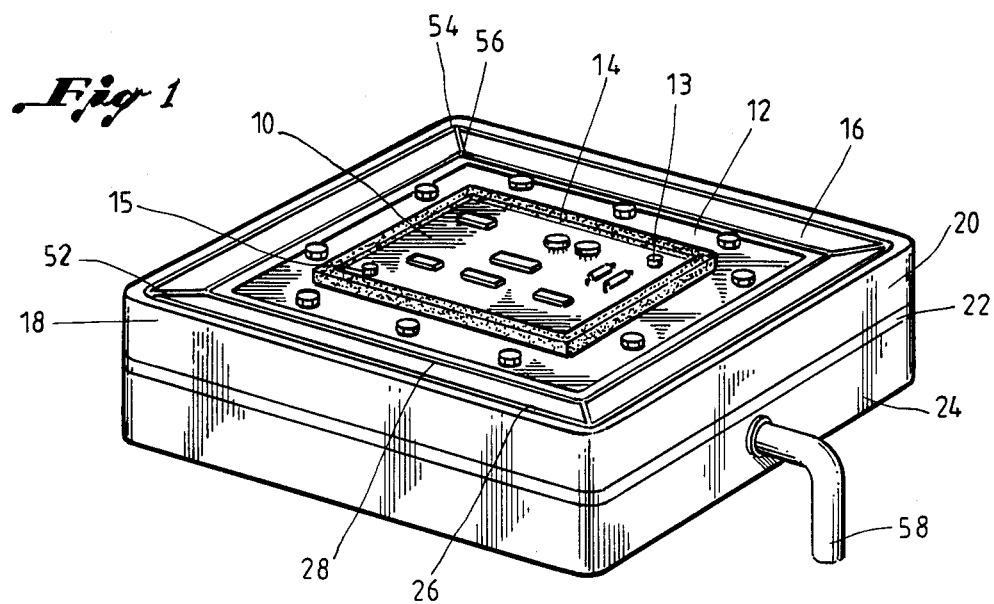
FIG. 1 is a perspective view of the whole test fixture.

FIG. 1 shows the assembled test fixture. The circuit board which is to be tested, 10, is located on top of the top plate 12, within the seal 14 which is attached to the top plate. This seal, which is preferably of closed-cell neoprene foam, provides a substantially air tight seal between the board 10 and the top plate 12 and around the edges of the board 10 when the fixture is partially evacuated. Preferably, the circuit board 10 is positioned on the top plate 12 by means of short tooling pins 13 attached to the top plate and tooling holes 15 in the board 10 which fit over the pins 13. The top plate 12 is located within the upper rim 16 of the housing 18. The housing is made of a semi-flexible material, the polyolefin group of plastics being particularly suitable. An unfilled, copolymer of polypropylene is used in the preferred embodiment.

The housing 18 has continuous side walls 20 which are attached at their lower edges to the platen 22. The platen 22 rests on the base 24 which houses connections to conventional printed circuit board test equipment.

Figure 2:
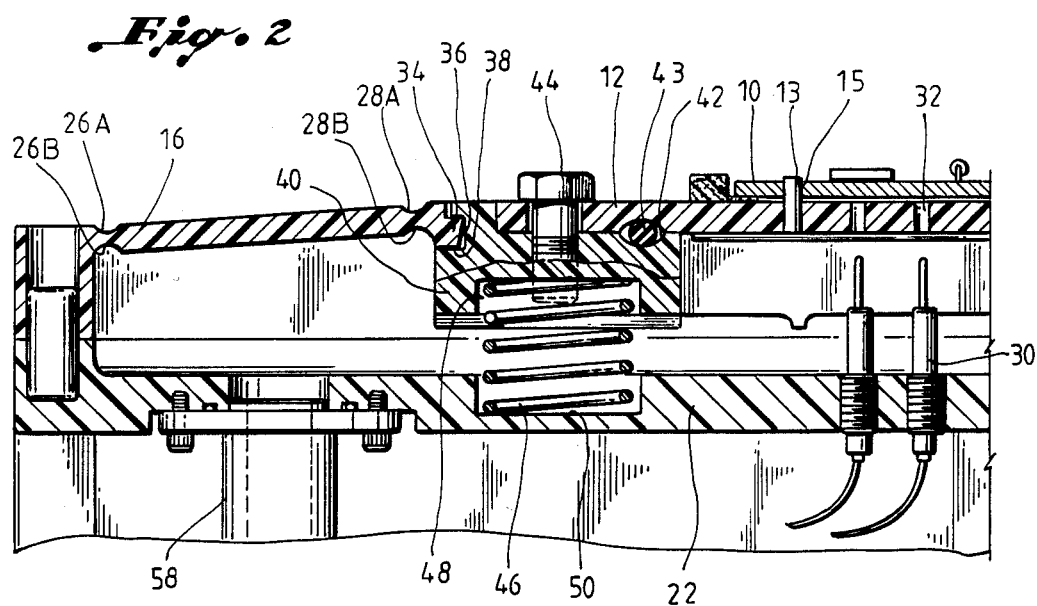
FIG. 2 is a vertical cross section through the top, housing and platen of the test fixture.

FIG. 2 shows a vertical cross section through the fixture, excluding the base 24. The upper rim 16 of the housing 18 is provided with two pairs of opposing grooves 26 and 28, each pair of grooves consisting of a groove, 26A and 28A, with a cross-sectional profile of a segment of a circle less than a semi-circle, on the upper surface, directly opposed to a groove, 26B and 28B, of the same cross-sectional profile on the lower surface of the rim 16. In the preferred embodiment, the upper rim is approximately 0.095 inches thick in the unscored section, and the grooves are sections of a circle of radius approximately 0.062 inches, with a maximum depth of approximately 0.017 inches.

The platen 22 carries an array of test probes 30 of a conventional, internal spring type. The placement of the probes is determined by the location of the test nodes on the board to be tested, by a method well known to those skilled in the art.

The top plate 12, is provided with holes 32, arranged so that the probes 30 can pass through the top plate and make contact with the lower side of the circuit board 10.

The inner edge of the rim 16 is supplied with a stepped down portion 34, the inner edge 36 of which is sloped inwards and downwards at a slight angle, preferably about 10°. This portion 34 snap fits into a groove 38 around the outer edge of the top retainer 40. The top retainer is preferably made of a substantially rigid material, such as glass reinforced polycarbonate.

The upper surface of the top retainer 40 is scored with a groove 42 around the entire circumference, located near the inner edge. A seal 44, preferably of the 'O' ring type of neoprene rubber or similar material, is located in groove 42. The top plate 12 fits onto the top retainer 40, and is secured in substantially air tight contact by means of a number of top tie down screws 44 located around the outer periphery of the top plate 12.

A number of springs 46 are located around the circumference of the top plate retainer 40, with their upper ends located in suitably shaped indentations 48 in the lower surface of the top plate retainer and their lower ends located in corresponding indentations 50 in the upper surface of the platen 22.

The arrangement of the paired grooves 26 and 28 on the upper rim 16 is further provided with sets of paired grooves 52 directly opposed on the upper and lower surfaces of the rim, extending from the groove 28 at each outer corner 54 of the rim 16 to groove 26 at the corresponding inner corner 56. Preferably, these grooves have the cross-sectional profile of a segment of a circle less than a semi-circle, the radius of the circle being approximately 0.125 inches, and the maximum depth of the groove being approximately 0.020 inches.

The board to be tested 10 is placed on top of the top plate 12, so that it is within and compressing the seal 14. The space between the platen 22, the top plate 12 and the housing 18 is then partially evacuated through the vacuum adapter 58. Air pressure then forces the board 10 down into contact with the top plate 12, the seal 14 providing a substantially air-tight seal around the edges of the board. As the evacuation continues, the top plate 12 is forced downwards by atmospheric pressure towards the platen 22. Before evacuation begins, the upper rim 16 is in the up position shown in FIG. 4. As the top plate begins to move downward, the rim 16 moves to the mid position shown in FIG. 5. As evacuation increases, with a corresponding increase of pressure on the top plate 12, the upper rim 16 begins to bow in a downward direction between the two pairs of grooves 26 and 28, as shown in FIG. 6. As the evacuation further increases, tensile and compressive forces in the rim 16 cause it to move into the lower, straight position shown in FIG. 7. Further downward movement is prevented by the ribs 60 on the lower side of the top plate 12 and top retainer 40.

Lateral movement of the top plate as it is moving into the lower position is prevented by the fact that the grooves extend completely around the top plate, so that there are substantially equal inward forces on each edge of the board providing equilibrium along both lateral axes of the board. These forces are the guidance means which ensure accurate registration between the board and the test probes.

In the lower position shown in FIG. 7 the probes 30 make electrical contact with the lower side of the board 10 through the holes 32. When the test procedure is complete, the vacuum is released. The springs 46 return the top plate 12 and the upper rim 16 to the up position shown in FIG. 4. The board is then removed by the operator, and the next board to be tested inserted to begin the test cycle again.

It is apparent on considering the motion of the upper rim 16 described above, that there will be a mismatch of motions at the corners. This problem is solved by the provision of the corner pairs of grooves 52, which form a flexible hinge capable of giving sufficiently to accommodate the mismatched motion of the adjacent sections of grooves 26 and 28 where they meet at the corners 54 and 56.

It will be appreciated that, as the means of guidance of the movement of the board in this invention does not require sliding contact between parts, the disadvantages of the prior art such as sticking, wear and lateral movement resulting from the tolerances required to permit such sliding are eliminated.

It has also been found that the simplicity of the design of the test fixture invented by applicants provides a longer life with less maintenance required. It also results in a superior air tight seal over prior art fixtures, and a lower manufacturing cost.

A further advantage is that the operation of the "hinge" mechanism of the housing provides a sufficiently high velocity of impact between the probes and the board, so that the probes can penetrate any dirt, oxidation or residue on the test points.

Additional advantages and modifications will be readily apparent to those skilled in the art. The invention is its broader aspects is therefore not limited to the specific details, representative apparatus or the illustrative example shown and described. Accordingly, departures may be made from the detail without departing from the spirit or scope of the disclosed general inventive concept.

What is claimed is:

1. A test fixture for use in the electrical testing of printed circuit boards comprising;
   a substantially rigid platen carrying a plurality of electrical test probes;
   a substantially rigid top plate adapted to support a printed circuit board;
   a semi-flexible housing attached to the platen and supporting the top plate above the platen, the housing being provided with flexion means adapted to permit movement of the top plate and the circuit board from an upper position in which the circuit board is held spacedly above the probes to a lower position in which the probes are in electrical contact with the circuit board, said flexion means being further adapted to guide the movement of the top plate and circuit board in a substantially linear manner so as to provide that each test probe contacts a predetermined corresponding test point on the circuit board;

means for moving the circuit board from the upper to the lower position; and means for returning the housing to the upper position when the testing is completed.

2. A test fixture as described in claim 1, wherein the means for moving the circuit board from the upper to the lower position is the creation of a partial vacuum in the chamber defined by the housing, the platen, the top plate and the circuit board.

3. A test fixture as described in claim 1, wherein the housing comprises an upper rim into which the top plate is sealingly attached and a side wall extending around the outer periphery of the rim and adapted to sealingly attach to the platen, the upper rim being provided with the flexion means.

4. A test fixture as described in claim 3, wherein the flexion means is at least one pair of grooves opposed on the upper and lower surfaces of the rim, each pair of opposed grooves extending parallel to and completely around the periphery of the rim.

5. A test fixture as described in claim 3, wherein the flexion means is two pairs of grooves opposed on the upper and lower surfaces of the rim, one pair of opposed grooves extending close to, parallel to and completely around the outer periphery of the rim and the other pair of opposed grooves extending close to, parallel to and completely around the inner periphery of the rim.

6. A test fixture as described in claims 4 or 5, wherein the flexion means further comprises a pair of opposed grooves extending diagonally from each of the outer corners of the rim to the nearest inner corner of the rim.

7. A test fixture as described in claim 1, wherein the housing is made of a semi-flexible plastics material.

8. A test fixture as described in claim 1, wherein the housing is made of a polyolefin plastic.

9. In a test fixture for use in the electrical testing of printed circuit boards of the type in which the circuit board is supported above a platen which carries an array of electrical test probes and in which the circuit board is moved into electrical contact with the probes in order to carry out the testing, a means of guiding the movement of the circuit board so as to provide that each test probe contacts a predetermined corresponding test point on the circuit board comprising;

a support for the circuit board, the support being provided with flexion means adapted to permit movement of the circuit board and to guide the movement of the circuit board in a substantially linear manner so as to provide that each test probe contacts a predetermined corresponding test point on the circuit board.

10. A means of guiding the movement of the circuit board as described in claim 9, wherein the support comprises a semi-flexible housing attached to the platen and supporting the circuit board above the platen, the housing having an upper rim sealingly attached to a means for carrying the circuit board and a side wall extending around the outer periphery of the rim and adapted to attach to the platen, the upper rim being provided with the flexion means.

11. A means of guiding the movement of the circuit board as described in claim 10, wherein the flexion means is at least one pair of grooves opposed on the upper and lower surfaces of the rim, each pair of opposed grooves extending parallel to and completely around the periphery of the rim.

12. A means of guiding the movement of the circuit board as described in claim 10, wherein the flexion means is two pairs of grooves opposed on the upper and lower surfaces of the rim, one pair of opposed grooves extending close to, parallel to and completely around the outer periphery of the rim and the other pair of opposed grooves extending close to, parallel to and completely around the inner periphery of the rim.

13. A means of guiding the movement of the circuit board as described in claims 11 or 12, wherein the flexion means further comprises a pair of opposed grooves extending diagonally from each of the outer corners of the rim to the nearest inner corner of the rim.

14. A means of guiding the movement of the circuit board as described in claim 10, wherein the housing is made of a semi-flexible plastics material.

15. A means of guiding the movement of the circuit board as described in claim 10, wherein the housing is made of a polyolefin plastic.

* * * * *